(12) United States Patent  
Doris et al.

(10) Patent No.: US 9,899,253 B2
(45) Date of Patent: Feb. 20, 2018

(54) FABRICATION OF SILICON GERMANIUM-ON-INSULATOR FINFET

(71) Applicants: INTERNATIONAL BUSINESS MACHINES CORPORATION, Armonk, NY (US); STMICROELECTRONICS, INC., Coppell, TX (US)

(72) Inventors: Bruce Doris, Slingerlands, NY (US); Hong He, Schenectady, NY (US); Qing Liu, Watervliet, NY (US)

(73) Assignees: INTERNATIONAL BUSINESS MACHINES CORPORATION, Armonk, NY (US); STMICROELECTRONICS, INC., Coppell, TX (US)

( * ) Notice: Subject to any disclaimer, the term of this patent is extended or adjusted under 35 U.S.C. 154(b) by 0 days.

(21) Appl. No.: 15/262,034

(22) Filed: Sep. 12, 2016

(65) Prior Publication Data
US 2016/0379867 A1  Dec. 29, 2016

Related U.S. Application Data

(62) Division of application No. 14/588,116, filed on Dec. 31, 2014, now Pat. No. 9,515,185.

(51) Int. Cl.
*H01L 21/762* (2006.01)
*H01L 29/78* (2006.01)
(Continued)

(52) U.S. Cl.
CPC .... *H01L 21/76283* (2013.01); *H01L 21/0217* (2013.01); *H01L 21/02164* (2013.01); *H01L 21/02532* (2013.01); *H01L 21/2254* (2013.01); *H01L 21/76224* (2013.01); *H01L 27/1211* (2013.01); *H01L 29/0649* (2013.01);
(Continued)

(58) Field of Classification Search
CPC ......... H01L 21/76283; H01L 29/66795; H01L 29/0649; H01L 29/785
See application file for complete search history.

(56) References Cited

U.S. PATENT DOCUMENTS 9,142,676 B2 * 9/2015 Ching ................... H01L 29/785
2004/0262687 A1 * 12/2004 Jung ....................... H01L 21/84
257/347

(Continued)

OTHER PUBLICATIONS

List of IBM Patents or Patent Applications Treated as Related; (Appendix P), Date Filed Sep. 12, 2016 2 pages.

(Continued)

*Primary Examiner* — Dung Le
(74) *Attorney, Agent, or Firm* — Cantor Colburn LLP; Steven Meyers

(57) ABSTRACT

A method of making a structurally stable SiGe-on-insulator FinFET employs a silicon nitride liner to prevent de-stabilizing oxidation at the base of a SiGe fin. The silicon nitride liner blocks access of oxygen to the lower corners of the fin to facilitate fabrication of a high-concentration SiGe fin. The silicon nitride liner is effective as an oxide barrier even if its thickness is less than about 5 nm. Use of the SiN liner provides structural stability for fins that have higher germanium content, in the range of 25-55% germanium concentration.

9 Claims, 11 Drawing Sheets

(51) Int. Cl.
*H01L 29/06* (2006.01)
*H01L 29/08* (2006.01)
*H01L 29/165* (2006.01)
*H01L 21/02* (2006.01)
*H01L 21/225* (2006.01)
*H01L 27/12* (2006.01)
*H01L 29/66* (2006.01)
*H01L 29/10* (2006.01)

(52) U.S. Cl.
CPC ...... *H01L 29/0847* (2013.01); *H01L 29/1054* (2013.01); *H01L 29/165* (2013.01); *H01L 29/66795* (2013.01); *H01L 29/785* (2013.01); *H01L 29/7848* (2013.01); *H01L 2029/7858* (2013.01)

(56) References Cited

U.S. PATENT DOCUMENTS

2014/0353767 A1* 12/2014 Liu ................. H01L 21/845
  257/401
2014/0374838 A1* 12/2014 Chen ............... H01L 27/0886
  257/401

OTHER PUBLICATIONS

Liu et al., "Silicon Germanium-on-Insulator FinFET", U.S. Appl. No. 14/588,116, filed Dec. 31, 2014.

* cited by examiner

FABRICATION OF SILICON GERMANIUM-ON-INSULATOR FINFET

DOMESTIC PRIORITY

This application is a divisional of the legally related U.S. application Ser. No. 14/588,116 filed Dec. 31, 2014 which is fully incorporated herein by reference.

BACKGROUND

Technical Field

The present disclosure generally relates to a strained channel FinFET device and, in particular, a high-germanium concentration strained channel FinFET device built on a substrate having a buried oxide layer.

Description of the Related Art

Advanced integrated circuits typically feature strained channel devices, silicon-on-insulator substrates, FinFET structures, or combinations thereof, in order to continue scaling transistor gate lengths below 20 nm. Such technologies allow the channel length of the transistor to shrink while minimizing detrimental consequences such as current leakage and other short channel effects.

A FinFET is an electronic switching device in which a conventional planar semiconducting channel is replaced by a semiconducting fin that extends outward from the substrate surface. In such a device, the gate, which controls current flow in the fin, wraps around three sides of the fin so as to influence the current flow from three surfaces instead of one. The improved control achieved with a FinFET design results in faster switching performance and reduced current leakage.

Incorporating strain into the channel of a semiconductor device alters the crystal lattice so as to increase charge carrier mobility in the channel. With greater carrier mobility, the device becomes a more responsive switch. Introducing a tensile strain into an NFET transistor stretches the crystal lattice, thereby increasing electron mobility in the channel, and resulting in a faster switching response to changes in voltage applied to the transistor gate. Likewise, introducing a compressive strain into a PFET transistor tends to increase hole mobility in the channel, also resulting in a faster switching response.

There are many ways to introduce strain into the channel region of a silicon transistor. Such techniques typically entail incorporating into the device epitaxial layers of one or more materials having crystal lattice dimensions or geometries that differ slightly from those of the silicon substrate. The epitaxial layers can be made of doped silicon or silicon germanium (SiGe), for example. Epitaxial layers can be incorporated into source and drain regions, into the transistor gate that is used to modulate current flow in the channel, or into the channel itself, which is a portion of the fin. In a FinFET, SiGe can be introduced by growing epitaxial sidewall extensions of the silicon fin to form a cladding.

Alternatively, strain can be induced in the fin from below the device by using various types of silicon-on-insulator (SOI) substrates. An SOI substrate features a buried insulator, typically a buried oxide layer (BOX) underneath the active area. SOI FinFET devices have been disclosed in patent applications assigned to the present assignee, for example, U.S. patent application Ser. No. 14/231,466, entitled "SOI FinFET Transistor with Strained Channel," which is hereby incorporated by reference in its entirety.

SUMMARY

While processing an SGOI FinFET, one problem that can arise is that oxygen present during certain processing steps can penetrate through the BOX at the base of the SiGe fin. Such oxidation at the base of the SiGe fin can preferentially elevate portions of the fin thereby de-stabilizing the fin structure and shortening the height of the fin. In some cases, such oxidation can cause the SiGe fin to collapse. In particular, SiGe fins in which the germanium content is greater than about 25% tend to be more vulnerable to structural instability. This is unfortunate, because high concentrations of germanium are desirable to allow the height of the fin to be tall and still maintain compressive strain to prevent relaxation of the fin material. If the strained SiGe fin relaxes, defects can migrate into the relaxed film, thereby reducing carrier mobility in the fin and causing the channel to be in a metastable state. A relaxed fin can only support a fin height less than about 35 nm with current processing technology. Thus, the problem of oxygen ingression at the base of the SiGe fins 110 presents a challenge for fabricating germanium-rich SiGe-on-insulator FinFET devices.

A method of making a stable SiGe-on-insulator FinFET employs a silicon nitride (SiN) liner to prevent oxidation at the base of the fin. Once the silicon nitride liner is in place to block access of oxygen atoms to lower corners of the fin, fabrication of the SiGe FinFET can continue in a conventional fashion. The silicon nitride liner is effective as an oxide barrier even if its thickness is less than about 5 nm. Use of the SiN liner provides stability for fins that have higher germanium content, in the range of 25-55% germanium.

BRIEF DESCRIPTION OF THE DRAWINGS

In the drawings, identical reference numbers identify similar elements or acts. The sizes and relative positions of elements in the drawings are not necessarily drawn to scale.

DETAILED DESCRIPTION

Figure 1A:
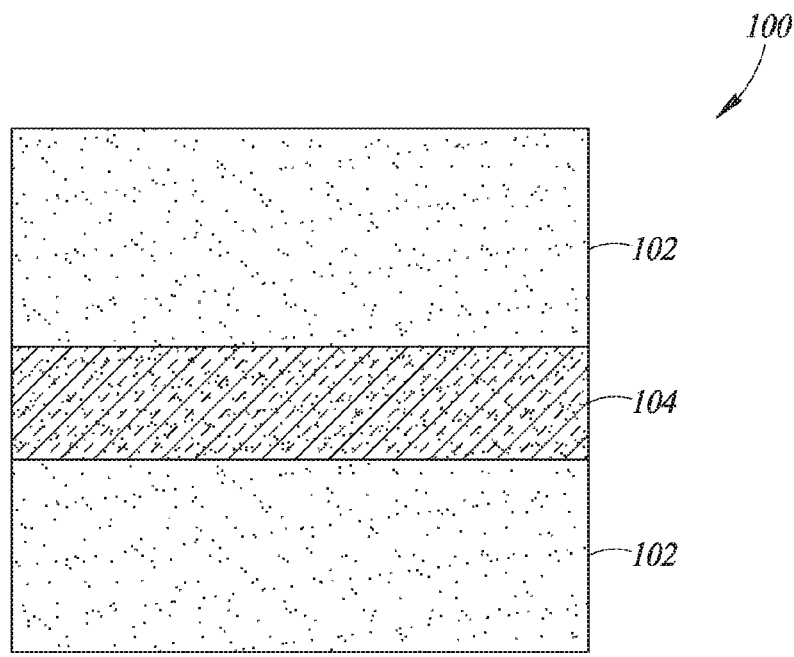
FIG. 1A is a cross-sectional view of a silicon substrate that includes a buried oxide layer (BOX).

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to SiGe-on-insulator devices that have been produced; however, the present disclosure and the reference to certain materials, dimensions, and the details and ordering of processing steps are exemplary and should not be limited to those shown.

Figure 1B:
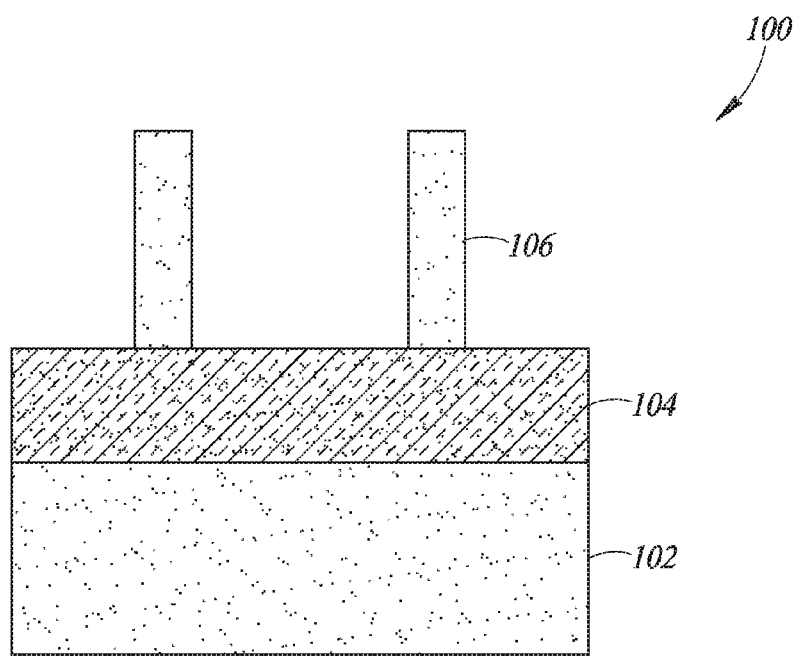
FIG. 1B is a cross-sectional view of a pair of fins formed from a portion of the silicon substrate that overlies the buried oxide layer of FIG. 1A.
Figure 1C:
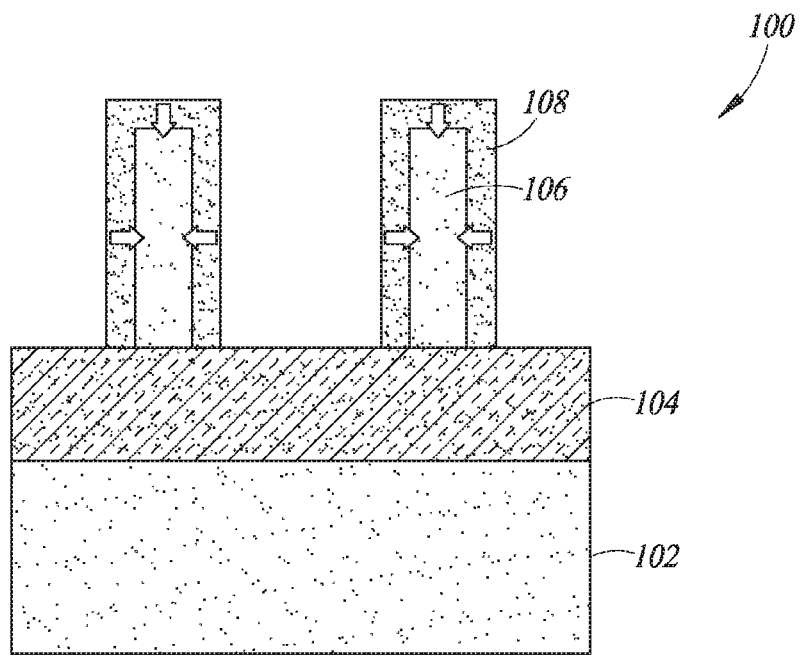
FIG. 1C is a cross-sectional view of the fins shown in FIG. 1B, clad in an epitaxially grown SiGe film.
Figure 1D:
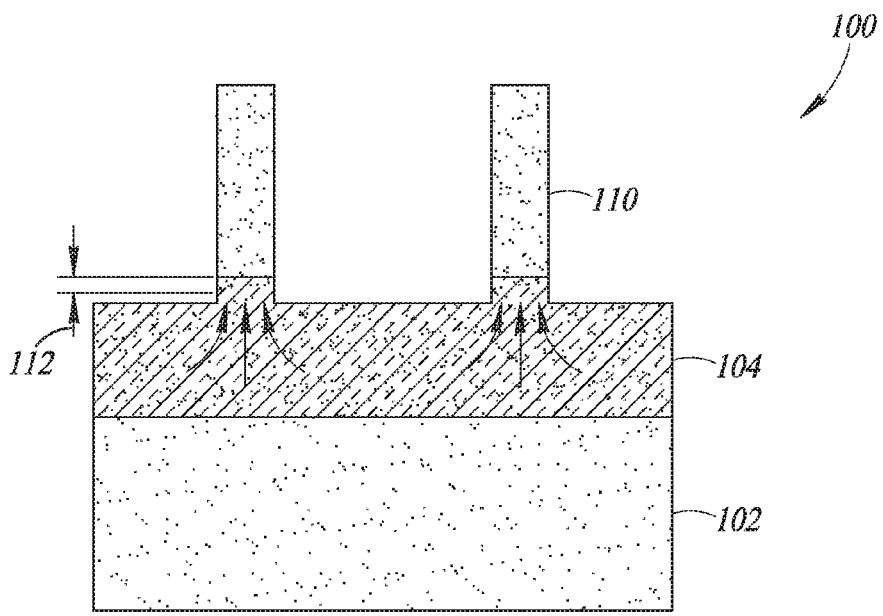
FIG. 1D is a cross-sectional view of oxidation at the base of the fins during drive-in of germanium from the SiGe cladding into the fin, according to the prior art.

Turning now to the figures, a popular technique is illustrated in FIGS. 1A-1D for fabricating a SiGe fin 110 for use in a conventional SiGe-on-insulator FinFET device, according to the prior art. The conventional SiGe fin 110, shown in cross-section in FIG. 1D, is formed from a silicon substrate 102 in which there is a buried oxide layer (BOX) 104, having a thickness in the range of about 140-200 nm. The silicon substrate 102, including the BOX 104, is typically supplied as a silicon-on-insulator (SOI) starting material 100 by a wafer manufacturer, as shown in FIG. 1A. An active region of the silicon substrate 102, above the BOX 104, is etched to form a high aspect ratio silicon fin 106, about 6-12 nm wide and 30-50 nm tall, as shown in FIG. 1B. The patterning process used to pattern the high aspect ratio silicon fins 106 may employ a conventional silicon nitride (SiN) hard mask, or the process may entail use of a self-aligned sidewall image transfer (SIT) technique which is also well known in the art and therefore is not explained herein in detail. The SIT process is capable of defining very high aspect ratio silicon fins 106 using silicon nitride (SiN) sidewall spacers as a hard mask. According to the SIT technique, a mandrel, or temporary structure, is formed first, and then silicon nitride is deposited conformally over the mandrel and planarized to form sidewall spacers on the sides of the mandrel. Then the mandrel is removed, leaving behind a pair of narrow sidewall spacers that serve as a mask to create a pair of silicon fins 106.

After silicon fins 106 are formed, a cladding 108 can be epitaxially grown outward from the top and sides of the silicon fins 106. In the present example, the cladding 108 is made of SiGe, however, the cladding 108 generally can have a different composition. The cladding 108 will serve as a source of germanium for creating a SiGe fin. After the cladding 108 is formed, germanium atoms are driven from the cladding 108 into the silicon fin 106 using a condensation process, as indicated by the arrows shown in FIG. 1C, to produce a compound fin made of SiGe. When other materials are used for the cladding, 108, different compound fins can be formed.

The resulting compound SiGe fin 110, shown in FIG. 1D, has a substantially uniform structure in which germanium atoms are incorporated throughout the silicon crystal lattice. However, oxygen atoms from the condensation process can penetrate the BOX and oxidize a lower portion 112 of the SiGe fin 110, at the base of the fin. Such ingression of oxygen at the base of the SiGe fin 110 can preferentially elevate portions of the fin, thereby de-stabilizing the fin structure and shortening the height of the fin from the bottom end. Some fins may be shortened more than others, resulting in fin height non-uniformity. In extreme cases, oxidation of the lower portion 112 of the fin can cause the SiGe fin 110 to collapse. In particular, SiGe fins 110 in which the germanium content is greater than about 25% tend to be more vulnerable to structural instability. Partly because of oxygen ingression at the base of the fins, fabrication of germanium-rich SiGe-on-insulator FinFET devices has been problematic.

Figure 2:
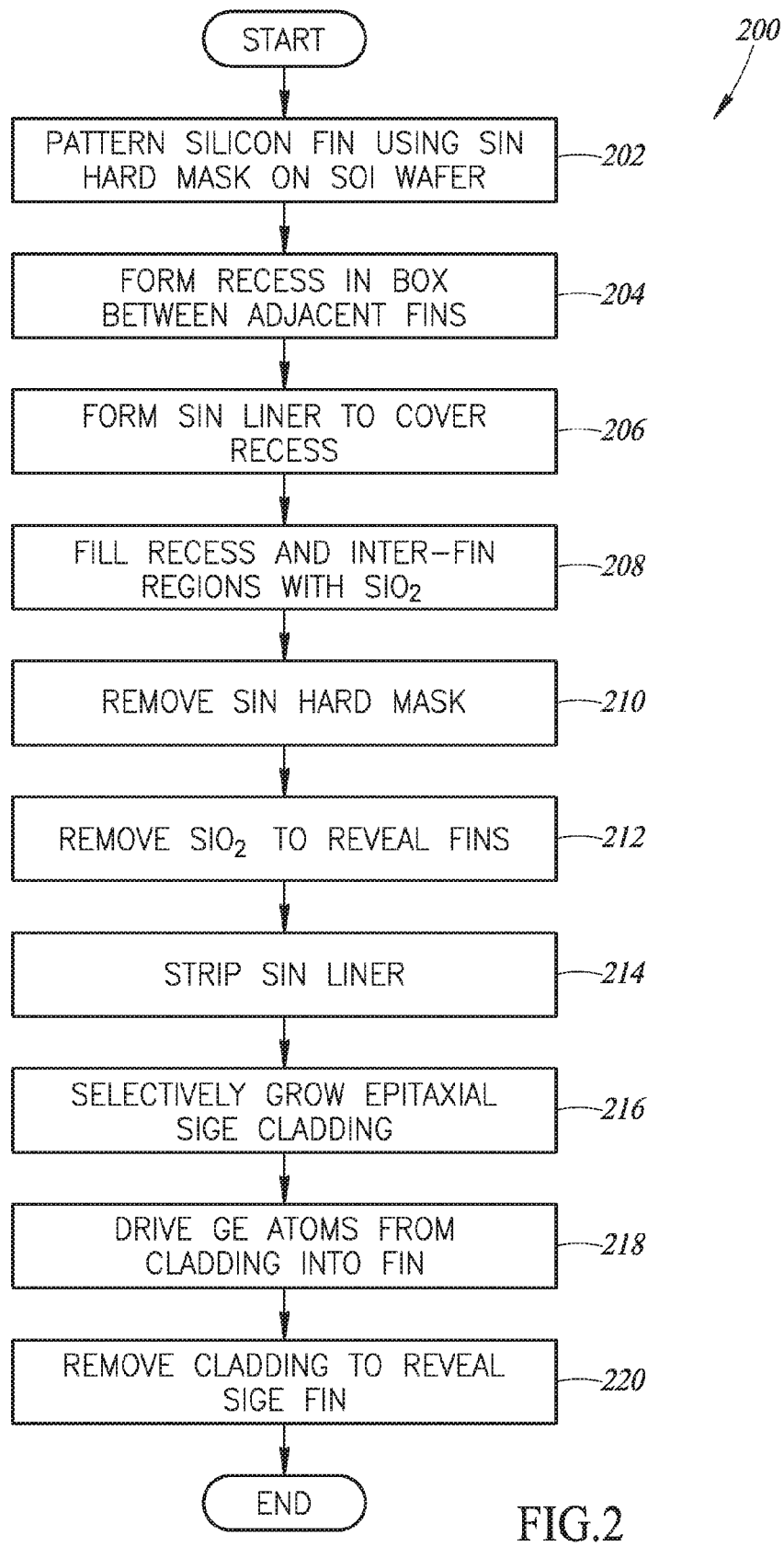
FIG. 2 is a flow diagram summarizing a sequence of processing steps that can be used to fabricate SiGe fins for an SGOI FinFET that are protected from oxidation at the base of the fins, according to one exemplary embodiment described herein.
Figure 3:
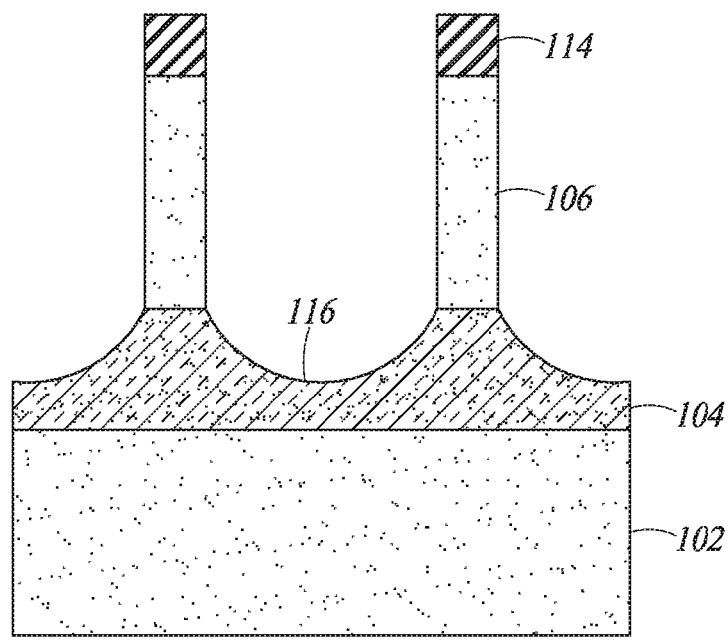
FIG. 3 is a cross-sectional view of a pair of silicon fins on a recessed insulating layer, according to one exemplary embodiment described herein.

FIG. 2 shows an exemplary sequence of steps in a method 200 of fabricating a robust SiGe fin 122 for use in an SGOI FinFET, according to one embodiment. Using the method 200, oxygen ingression at the base of the SiGe fin is prevented. According to the structure and method described herein, prevention against oxygen penetration at the base of the SiGe fin is provided by a SiN barrier underneath each fin. The SiN barrier has a substantially semi-circular shape surrounding the base of the SiGe fin from within the BOX 104. The steps 202-214 in the method 200 for fabricating the inventive SiGe fin are described further below, with reference to FIGS. 4-8.

At 202, the silicon fin 106 is formed on the SOI wafer as described above with reference to FIGS. 1A and 1B. In the example shown in FIG. 4, the silicon fin 106 is patterned using a SiN hard mask 114 of thickness within the range of about 30-50 nm. Alternatively, the SIT technique can be used to pattern the silicon fin 106.

Figure 4:
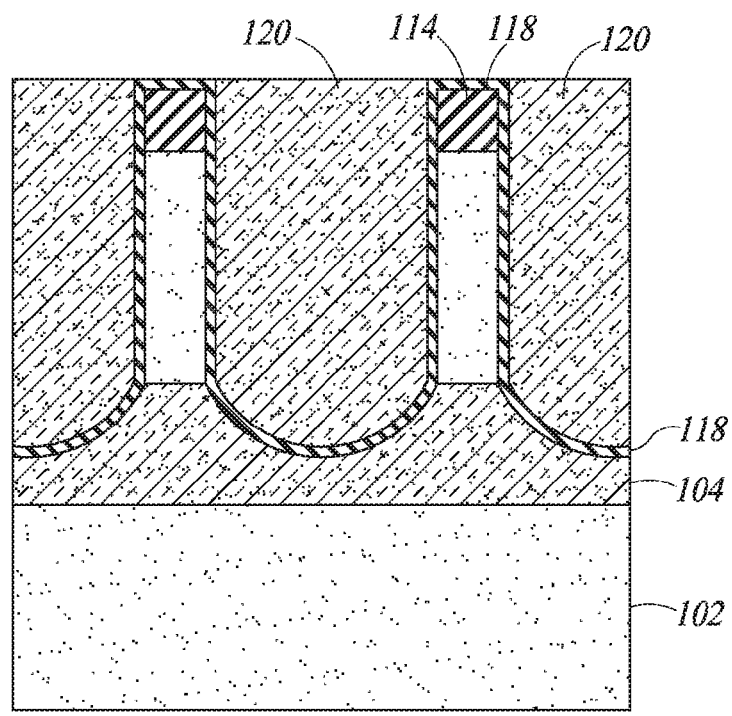
FIG. 4 is a cross-sectional view of the silicon fins and the recessed insulating layer shown in FIG. 3, covered with a liner, according to one exemplary embodiment described herein.

At 204, the BOX between adjacent silicon fins 106 is recessed by about 10 nm to form shallow depressions 116, as shown in FIG. 4. Recessing the BOX can be accomplished with an isotropic over-etch step at the end of the fin etching process, or, for example, by adding a wet etch step, e.g., a dip in hydrofluoric (HF) acid, which will attack the BOX with high selectivity to the silicon fin 106 and the SiN hard mask 114.

Figure 5:
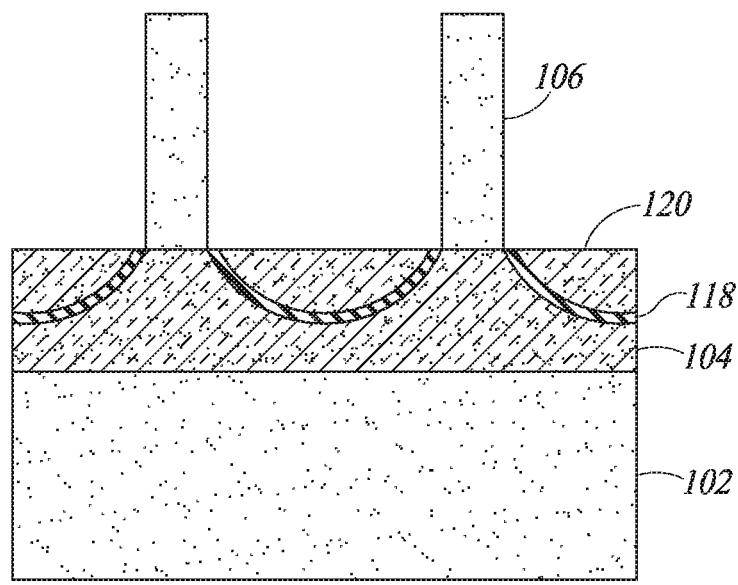
FIG. 5 is a cross-sectional view of a pair of silicon fins on an insulating layer that contains a buried oxidation barrier, according to one exemplary embodiment described herein.

At 206, a thin layer of SiN is deposited conformally as a liner 118 covering the shallow depressions 116, sidewalls of the fins 106, and the SiN hard mask 114, as shown in FIG. 5. The liner 118 desirably has a thickness of about 3 nm. It is the liner 118 that will protect the fin from potential oxide penetration at a subsequent step in the process 200.

At 208, a silicon dioxide (SiO2) filler 120 is formed within the shallow depressions 116 and within inter-fin regions between the fins 106, according to known methods. Formation of the SiO2 filler 120 is followed by an oxide planarization process that stops on a top surface of the conformal SiN liner 118.

At 210, the SiN hard mask 114 is removed down to the surface of the silicon fin 106. The hard mask removal can be done, for example, using a reactive ion etching process (RIE) that can be end-pointed on the silicon fins 106, so as not to attack the SiN liner 118 on the sidewalls of the fins 106 and the shallow depressions 116.

Figure 6:
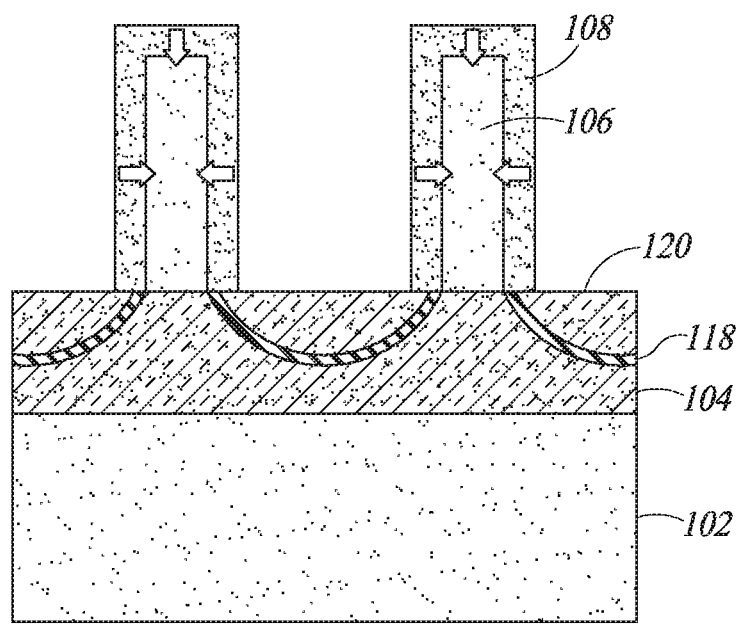
FIG. 6 is a cross-sectional view of the silicon fins shown in FIG. 5 clad in SiGe, according to one exemplary embodiment described herein.

At 212, the SiO2 filler 120 is recessed to reveal the fins 106 as shown in FIG. 6. The oxide recess can be accomplished using, for example, an RIE process that is timed to cease etching slightly above the bottoms of the fins 106, so as not to remove portions of the SiO2 filler 120 in the shallow depressions 116. Following the oxide recess, the fins 106 will remain, covered with the SiN liner 118.

At 214, the SiN liner 118 is stripped using, for example, an HF-EG wet etch process in which hydrofluoric acid (HF) and ethylene glycol (EG) are combined to form a chemical mixture that removes both SiN and SiO2 at substantially equal rates. The HF-EG formulation is advantageous in that it has a slow etch rate compared with HF alone that provides superior process control when etching either SiN or SiO2.

The resulting silicon fins 106, having buried SiN liners 118 that serve as barriers, henceforth are protected against oxide penetration at the base of the fin, as shown in FIG. 6. In particular, upper ends of the SiN liners 118, in contact with lower corners of the fins, will effectively block oxide penetration of the SiGe fin at one or more subsequent processing steps.

Once step 214 has been executed in the method 200, preparation of the substrate 102 to withstand subsequent incorporation of the germanium component is complete.

Figure 7:
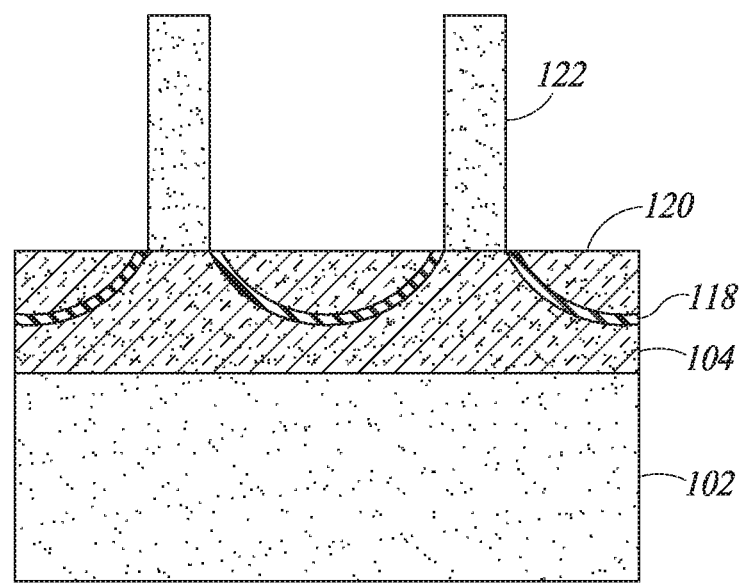
FIG. 7 is a cross-sectional view of a pair of stable SiGe fins on an insulating layer, in which no oxidation is present at the base of the fins, according to one exemplary embodiment described herein.

At 216, with reference to FIG. 7, the SiGe cladding 108 is formed by selective epitaxial growth from exposed surfaces of the silicon fins 106, as described above.

At 218, a condensation process is used to incorporate germanium into the silicon fins 106 to produce SiGe fins 122 that provide enhanced carrier mobility in the channels of the FinFET device. Because the SiN liners 118 located below the SiGe fins 122 present a barrier to oxygen migration, the base of the newly-formed SiGe fins 122 remains intact, providing a stable foundation for a FinFET.

At 220, the SiGe cladding 108, having been depleted of germanium, is removed to reveal the SiGe fins 122.

FIGS. 8A-8D show views of completed strained channel SiGe-on-insulator FinFET devices that include the protective SiN liners 118, according to one embodiment. The devices shown in FIGS. 8A-8D can be fabricated according to the method shown in FIG. 9 and described below.

Figure 9:
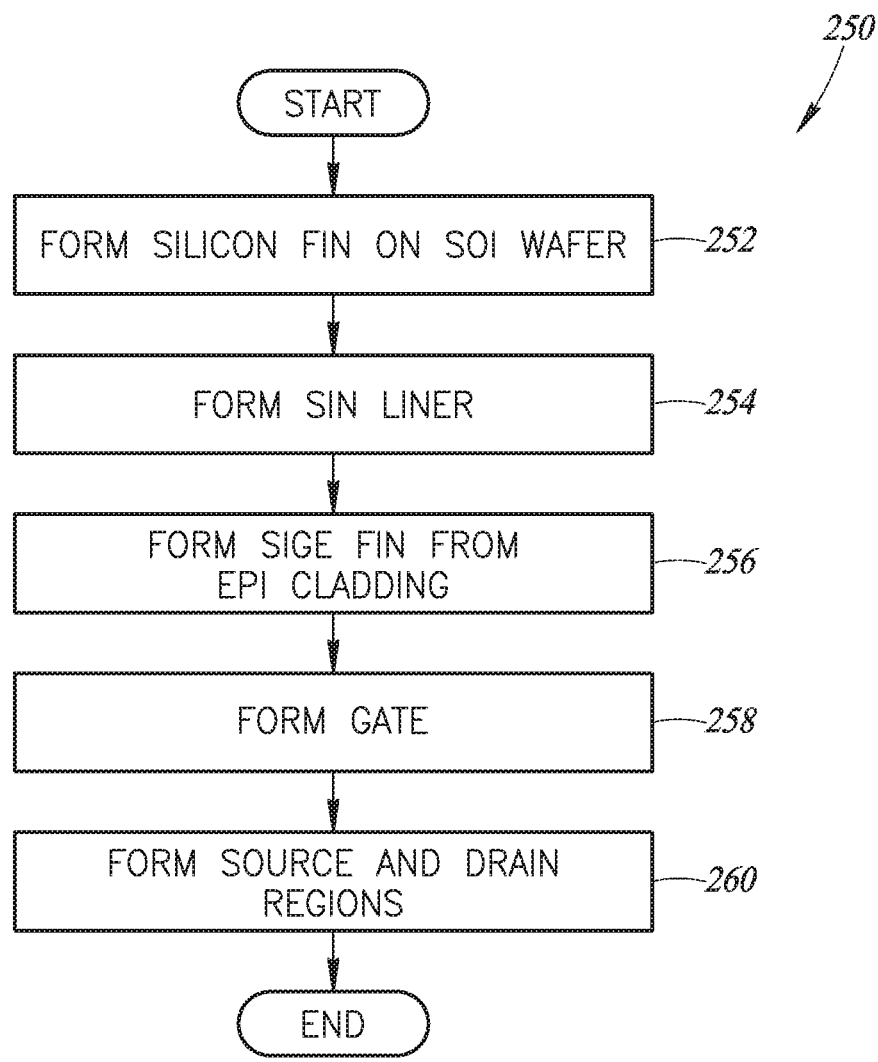
FIG. 9 is a flow diagram summarizing a sequence of processing steps that can be used to fabricate stable, germanium-rich SGOI FinFETs, according to one exemplary embodiment described herein.

FIG. 9 shows a high-level sequence of steps in a method 250 of fabricating a SiGe-on-insulator FinFET, according to one embodiment. The method 250 illustrates how a SiGe fin 122 can be incorporated into a strained SiGe FinFET device such as, for example, a metal gate strained FD-SOI FinFET as described in U.S. patent application Ser. Nos. 14/231,466 or 14/584,161, which are assigned to the same assignee as the present patent application and are hereby incorporated by reference in their entireties.

At 252, the silicon fin 106 is formed on an SOI wafer, as described above.

At 254, the SiN liner is formed in the BOX 104 underneath the silicon fin 106, as described above.

At 256, an epitaxial SiGe cladding is grown from the silicon fin 106, and then germanium is incorporated from the SiGe into the silicon fins 106 to form the SiGe fins 122, as described above. Generally, the germanium concentration can be greater than 25%. In one embodiment, the germanium concentration is as high as 55%.

Figure 8A:
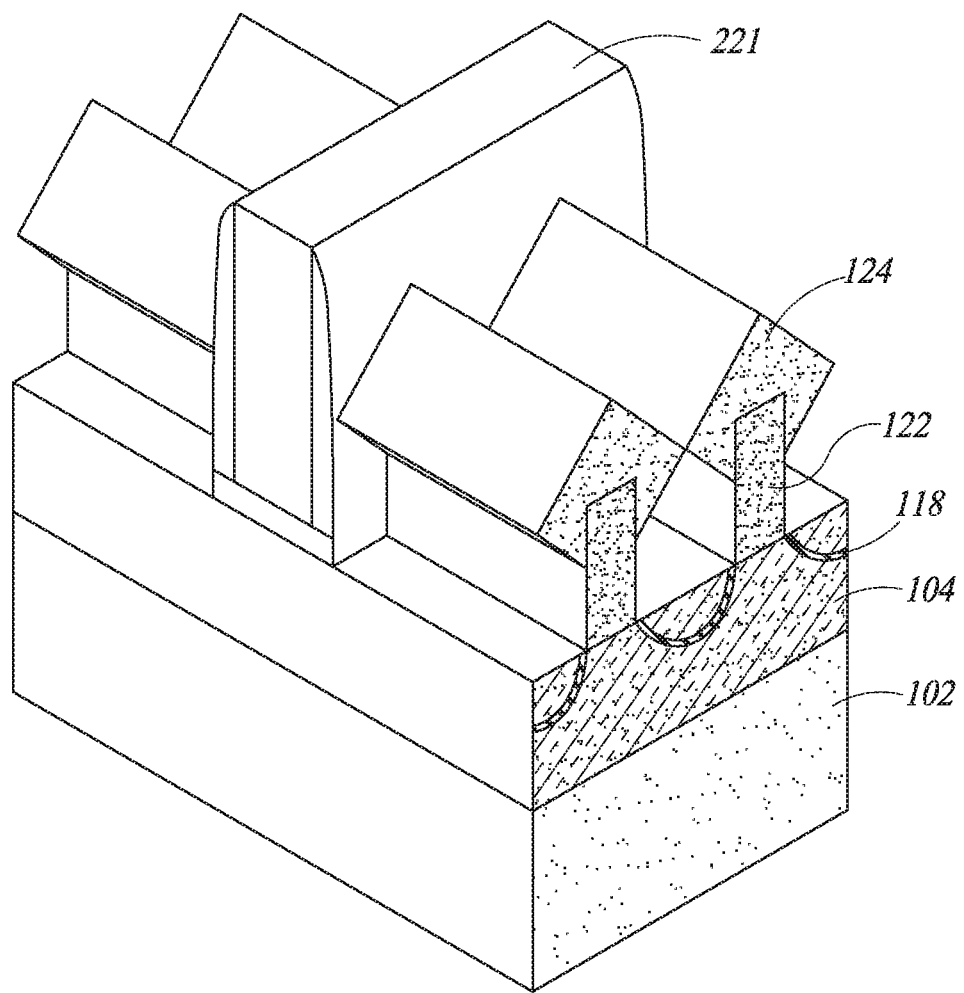
FIG. 8A is a perspective view of a SiGe-on-insulator FinFET, according to one exemplary embodiment described herein.
Figure 8B:
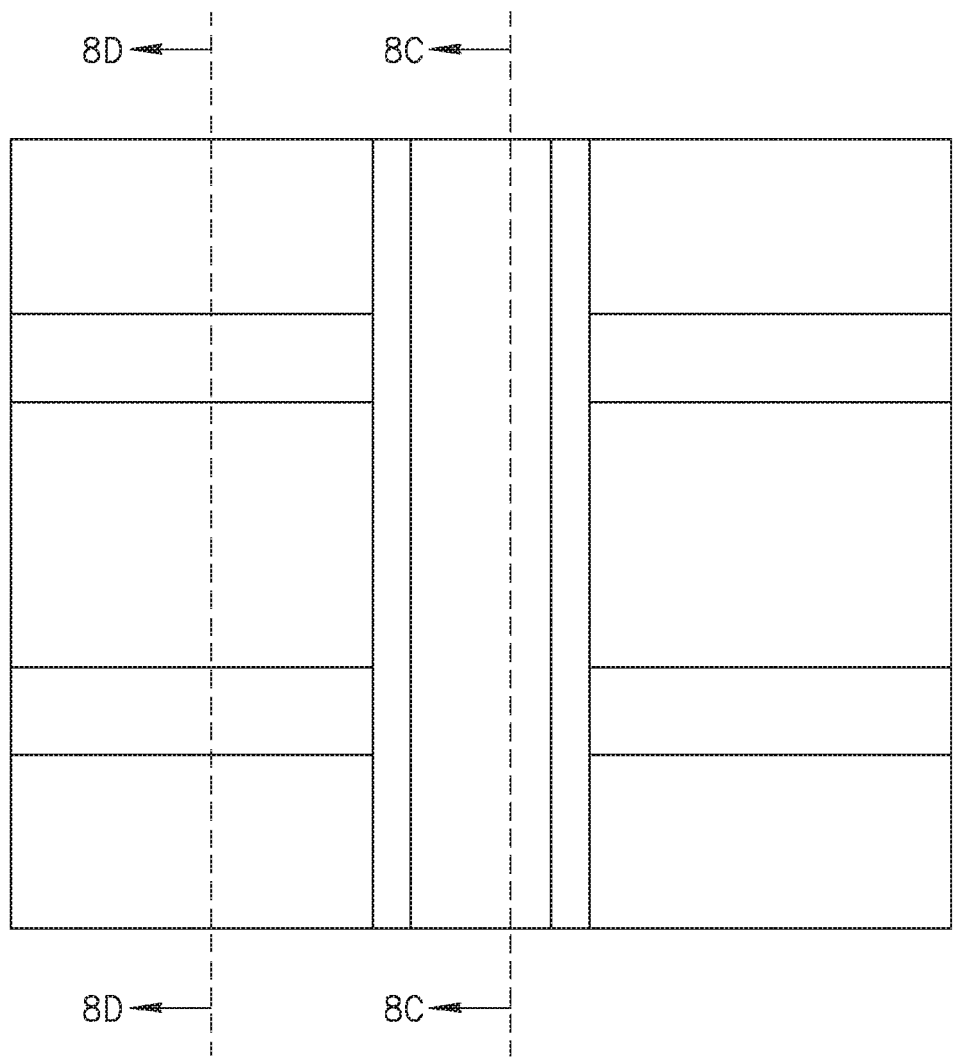
FIG. 8B is a top plan view of an exemplary layout of the SiGe-on-insulator FinFET shown in FIG. 8A.
Figure 8C:
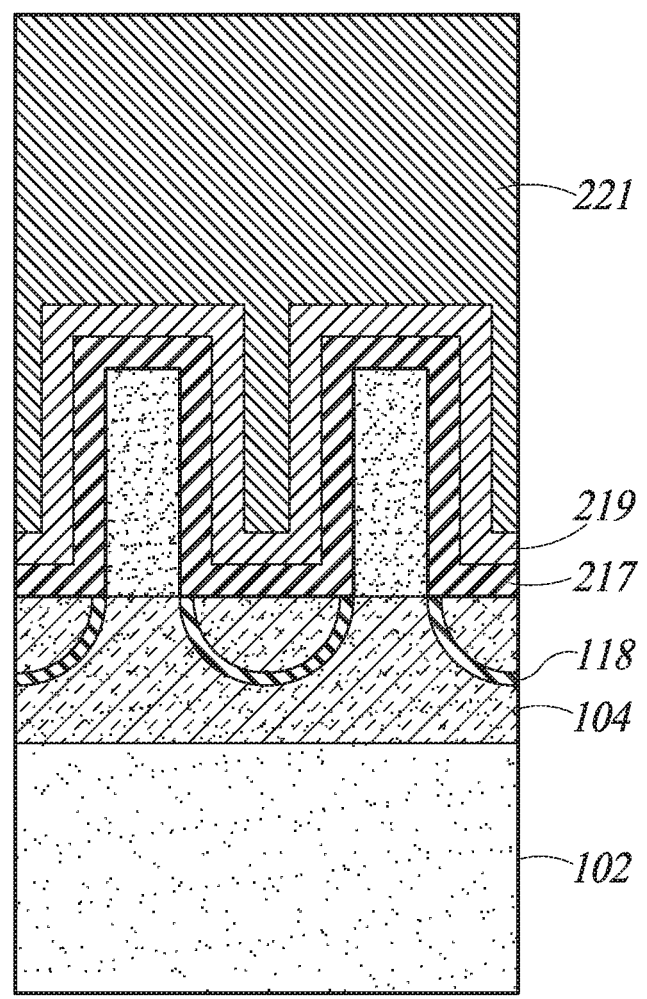
FIG. 8C is a cross-sectional view showing an exemplary gate stack of the FinFET shown in FIGS. 8A and 8B, according to one exemplary embodiment described herein.
Figure 8D:
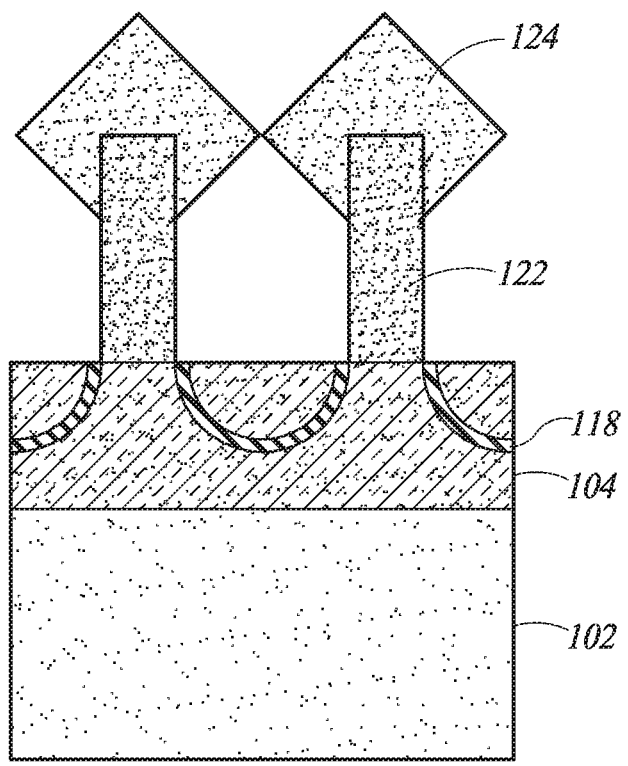
FIG. 8D is a cross-sectional view through the source/drain region of p-type SiGe-on-insulator fins shown in FIGS. 8A and 8B.

At 258, a gate structure is formed that wraps around three sides of the SiGe fin 122, as is known in the art. An exemplary gate structure is shown in FIG. 8A, and in cross-section in FIG. 8C. In one embodiment, the gate structure includes a thin gate dielectric 217 made of a high-k material such as HfO2, and a metal gate 221. The gate dielectric 217 desirably has a thickness in the range of about 3-5 nm. In one embodiment, the metal gate 221 is made of different materials for NFET and PFET devices. Either the PFET, the NFET, or both may also include an additional gate stack layer 219 made of a work function metal to create additional strain, or to tune the amount of strain, in the channel region of the SiGe fin 122. Alternatively, a replacement metal gate (RMG) process can be used, as is known in the art. In the RMG process, a temporary gate structure, typically made of polysilicon, is formed at 258, and is later replaced after 260, by a metal gate structure.

At 260, source and drain regions can be formed from, or adjacent to, portions of the fin outside the gate structure, to serve as charge reservoirs for the SiGe-on-insulator FinFET. In one embodiment, raised source and drain regions can be formed as epitaxial extensions 124 grown outward from the SiGe fins 122. The epitaxial extensions 124 in the example shown in FIGS. 8A and 8D have diamond-shaped profiles and they are merged, meaning that the epitaxial extensions 124 touch one another. However, in general, the profiles can have a variety of shapes, and depending on their application, the epitaxial extensions may be merged or un-merged, i.e., separated from one another. Epitaxial source/drain extensions 124 are shown and discussed in further detail in U.S. patent application Ser. No. 14/584,161.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

The invention claimed is:

1. A method of fabricating a fin for use in a FinFET, the method comprising:
    forming a silicon fin from an upper portion of a silicon substrate having an oxide layer buried therein;
    forming a recess in the buried oxide layer between the silicon fin and an adjacent silicon fin;
    forming a liner that covers a surface of the recess, the liner contacting a bottom corner of the silicon fin;
    filling the recess with silicon dioxide;
    selectively growing an epitaxial cladding from the silicon fin;
    driving atoms from the cladding into the silicon fin; and
    removing the cladding to reveal a compound fin;
    wherein the liner provides a barrier to block migration of oxygen into the compound fin while driving atoms from the cladding into the silicon fin.

2. The method of claim 1 wherein the cladding is made of germanium.

3. The method of claim 2 wherein driving germanium atoms into the silicon fin uses a condensation process that produces a germanium concentration in a range of 25-55%.

4. The method of claim 1 wherein the recess has a recess depth in a range of 5-15 nm.

5. The method of claim 1 wherein the liner is made of silicon nitride.

6. The method of claim 1, wherein the liner prevents against oxygen penetration at a base of the silicon fin.

7. The method of claim 1, wherein the liner is formed between two oxide layers.

8. The method of claim 1, wherein the liner has a substantially semi-circular shape surrounding a base of the silicon fin.

9. The method of claim 1, wherein the liner covers sidewalls of the silicon fin.

\* \* \* \* \*